United States Patent
Buie et al.

(10) Patent No.: US 7,018,934 B2
(45) Date of Patent: Mar. 28, 2006

(54) METHODS AND APPARATUS FOR ETCHING METAL LAYERS ON SUBSTRATES

(75) Inventors: Melisa J. Buie, San Jose, CA (US); Brigitte C. Stoehr, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 317 days.

(21) Appl. No.: 10/235,223

(22) Filed: Sep. 4, 2002

(65) Prior Publication Data

US 2003/0049934 A1 Mar. 13, 2003

Related U.S. Application Data

(60) Provisional application No. 60/317,046, filed on Sep. 4, 2001.

(51) Int. Cl.
*H01L 21/302* (2006.01)

(52) U.S. Cl. .................. 438/714; 438/706; 438/715; 216/72

(58) Field of Classification Search .......... 438/706, 438/710, 712, 714, 715, 720, 725; 216/57, 216/58, 68, 72

See application file for complete search history.

(56) References Cited

U.S. PATENT DOCUMENTS

| | | | |
|---|---|---|---|
| 4,350,563 A | 9/1982 | Takada et al. | |
| 4,406,733 A | 9/1983 | Tachi et al. | |
| 4,504,574 A | 3/1985 | Meyer et al. | |

(Continued)

FOREIGN PATENT DOCUMENTS

| | | |
|---|---|---|
| DE | 27 01 458 | 1/1977 |
| EP | 0 054 736 | 6/1982 |
| EP | 0 978 870 | 2/2000 |
| EP | 0 999 472 | 5/2000 |
| JP | 60 016422 | 1/1985 |
| JP | 60 219748 | 11/1985 |
| JP | 62 181433 | 8/1987 |
| JP | 11-131263 | 5/1999 |
| JP | 2001-33940 | 2/2001 |
| JP | 2001-33940 | 6/2003 |
| WO | WO 00/67281 | 11/2000 |
| WO | WO 01/96955 | 12/2001 |

OTHER PUBLICATIONS

PCT International Search Report dated Feb. 14, 2005 for PCT/US2004/008335. (AMAT/7681PCT).
PCT Written Opinion dated Feb. 14, 2005 for PCT/US2004/008335. (AMAT/7681PCT).
Mohri, et al., "Manufacturing of Half–Tone Phase Shift Masks: I. Blank" Proceedings of the SPIE—The International Society for Optical Engineering USA, vol. 2254, 1994, pp. 238–247.
Miyashita, et al., "Manufacturing of Half–Tone Phase Shift Masks: II. Writing and Process", Proceedings of the SPIE—The International Society for Optical Engineering USA, vol. 2254, 1994, pp. 248–260. (AMAT/7681CPT).

(Continued)

*Primary Examiner*—Lan Vinh
(74) *Attorney, Agent, or Firm*—Moser Patterson & Sheridan, LLP (57) ABSTRACT

Method and apparatus for etching a metal layer disposed on a substrate, such as a photomask, are provided. In one aspect, a method is provided for processing a substrate including positioning the substrate in a processing chamber, introducing a processing gas comprising (i) hydrogen chloride, (ii) an oxygen containing gas, (iii) another chlorine containing gas, and optionally, (iv) an inert gas into the processing chamber, wherein the substrate is maintained at a reduced temperature, and the processing gas is excited into a plasma state at a reduced power level to etch exposed portions of the metal layer disposed on the substrate.

26 Claims, 3 Drawing Sheets

U.S. PATENT DOCUMENTS

| | | | |
|---|---|---|---|
| 4,600,686 | A | | 7/1986 | Meyer et al. |
| 5,538,816 | A | | 7/1996 | Hashimoto et al. |
| 5,750,290 | A | | 5/1998 | Yasuzato et al. |
| 5,773,199 | A | | 6/1998 | Linliu et al. |
| 5,861,233 | A | | 1/1999 | Sekine et al. |
| 5,948,570 | A | | 9/1999 | Kornblit et al. |
| 5,994,235 | A | * | 11/1999 | O'Donnell ............ 438/720 |
| 6,007,732 | A | | 12/1999 | Hashimoto et al. |
| 6,033,979 | A | | 3/2000 | Endo |
| 6,080,529 | A | | 6/2000 | Ye et al. |
| 6,114,250 | A | | 9/2000 | Ellingboe et al. |
| 6,214,637 | B1 | | 4/2001 | Kim et al. |
| 6,251,217 | B1 | | 6/2001 | Ye et al. |
| 6,307,265 | B1 | | 10/2001 | Anand et al. |
| 6,391,791 | B1 | * | 5/2002 | Sasaki et al. ............ 438/725 |
| 6,472,107 | B1 | | 10/2002 | Chan |
| 6,635,185 | B1 | | 10/2003 | Demmin et al. |
| 6,709,901 | B1 | * | 3/2004 | Yamazaki et al. ........ 438/149 |
| 2003/0003374 | A1 | | 1/2003 | Bule et al. |
| 2003/0049934 | A1 | | 3/2003 | Bule et al. |

OTHER PUBLICATIONS

PCT International Search Report from International Application No. PCT/US02/27869, Dated Dec. 23, 2002.

PCT Search Report for PCT/US03/11549, dated Feb. 19, 2004 (AMAT/6991.PC).

Kwon, et al., "Loading Effect Parameters at Dry Etcher System and Their Analysis at Mask–to–Mask Loading and Within–Mask Loading" Proceedings of SPIE, vol. 4562 (2002) pp. 79–87.

Fujisawa, et al., "Evaluation of NLD Mask Dry Etching System" SPIE Symposium on Photomask and X–Ray Technology VI, Yokohama, JAPAN, Sep. (1999) vol. 3748 pp. 147–152.

Ruhl, et al., "Chrome Dry Etch Process Characterization Using Surface Nano Profiling" Proceedings of SPIE, vol. 4186 (2001) pp. 97–107.

Aoyama, et al. "Advanced Cr Dry Etching Process" SPIE Symposium on Photomask and X–Ray Technology VI, Yokohama, JAPAN, Sep. (1999) SPIE, vol. 3748 pp. 137–146.

Aoyama, et al., "Advanced Cr Dry Etching Process" SPIE Symposium on Photomask and X–Ray Technology VI, Yokohama, JAPAN, Sep. (1999) SPIE, vol. 3748 pp. 137–146.

Fujisawa, et al., "Evaluation of NLD Mask Dry Etching System" SPIE Symposium on Photomask and X–Ray Technology VI, Yokohama, JAPAN, Sep. (1999) vol. 3748 pp. 147–152.

Kwon, et al., "Loading Effect Parameters at Dry Etcher System and Their Analysis at Mask–to–Mask Loading and Within–Mask Loading" Proceedings of SPIE, vol. 4562 (2002) pp. 79–87.

PCT International Search Report from International Application No. PCT/US02/27869, Dated Dec. 23, 2002. (AMAT/6399PC).

PCT International Search Report for PCT/US01/19282, dated May 31, 2002 (AMAT/4213.PC).

PCT Search Report for PCT/US03/11549, dated Feb. 19, 2004 (AMAT/6991.PC).

Ruhl, et al., "Chrome Dry Etch Process Characterization Using Surface Nano Profiling" Proceedings of SPIE, vol. 4186 (2001) pp. 97–107.

\* cited by examiner

METHODS AND APPARATUS FOR ETCHING METAL LAYERS ON SUBSTRATES

CROSS-REFERENCE TO RELATED APPLICATIONS

This application claims priority to U.S. Provisional Patent Application Ser. No. 60/317,046, filed Sep. 4, 2001, which is incorporated herein by reference.

BACKGROUND OF THE INVENTION

1. Field of the Invention

The present invention relates to the fabrication of integrated circuits and to the fabrication of photomasks useful in the manufacture of integrated circuits.

2. Background of the Related Art

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.15 µm and even 0.13 µm feature sizes, and tomorrow's plants soon will be producing devices having even smaller geometries.

The increasing circuit densities have placed additional demands on processes used to fabricate semiconductor devices. For example, as circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Reliable formation of high aspect ratio features is important to the success of sub-micron technology and to the continued effort to increase circuit density and quality of individual substrates and die.

High aspect ratio features are conventionally formed by patterning a surface of a substrate to define the dimensions of the features and then etching the substrate to remove material and define the features. To form high aspect ratio features with a desired ratio of height to width, the dimensions of the features are required to be formed within certain parameters, which are typically defined as the critical dimensions of the features. Consequently, reliable formation of high aspect ratio features with desired critical dimensions requires precise patterning and subsequent etching of the substrate.

Photolithography is a technique used to form precise patterns on the substrate surface and then the patterned substrate surface is etched to form the desired device or features. Photolithography techniques use light patterns and photoresist materials deposited on a substrate surface to develop precise patterns on the substrate surface prior to the etching process. In conventional photolithographic processes, a photoresist is applied on the layer to be etched, and the features to be etched in the layer, such as contacts, vias, or interconnects, are defined by exposing the photoresist to a pattern of light through a photolithographic photomask which corresponds to the desired configuration of features. A light source emitting ultraviolet (UV) light, for example, may be used to expose the photoresist to alter the composition of the photoresist. Generally, the exposed photoresist material is removed by a chemical process to expose the underlying substrate material. The exposed underlying substrate material is then etched to form the features in the substrate surface while the retained photoresist material remains as a protective coating for the unexposed underlying substrate material.

Photolithographic photomasks, or reticles, typically include a substrate made of an optically transparent silicon based material, such as quartz (i.e., silicon dioxide, $SiO_2$), having an opaque light-shielding layer of metal, typically chromium, on the surface of the substrate. The metal layer is patterned to correspond to the features to be transferred to the substrate. Generally, conventional photomasks are fabricated by first depositing a thin layer of metal on a substrate comprising an optically transparent silicon based material, such as quartz, and depositing a photoresist layer on the thin metal layer. The photomask is then patterned using conventional laser or electron beam patterning equipment to define the critical dimensions in the photoresist. The metal layer is then etched to remove the metal material not protected by the patterned photoresist, thereby exposing the underlying silicon based material and forming a photomask. Photomasks allow light to pass therethrough in a precise pattern onto the substrate surface.

Conventional etching processes, such as wet etching, tend to etch isotropically, which can result in an undercut phenomenon to occur in the metal layer below the patterned photoresist. The undercut phenomenon can produce patterned features on the photomask that are not uniformly spaced nor do the features have desired straight, vertical sidewalls, thereby losing the critical dimensions of the features. Additionally, the isotropic etching of the features may overetch the sidewalls of features in high aspect ratios, resulting in the loss of the critical dimensions of the features. Features formed without the desired critical dimensions in the metal layer can detrimentally affect light passing therethrough and result in less than desirable patterning by the photomask in subsequent photolithographic processes.

Plasma etch processing, known as dry etch processing or dry etching, provides an alternative to wet etching and provides a more anisotropic etch than wet etching processes. The dry etching process has been shown to produce less undercutting and improve the retention of the critical dimensions of the photomask features with straighter sidewalls and flatter bottoms. In conventional dry etching processing, a plasma of etching gases, such as chlorine, oxidizing gases, such as oxygen, and inert gases, such as helium, are used to etch the metal layers formed on the substrate.

However, conventional dry etch chemistry tends to produce an over abundance of etching radicals, which make controlling the etch of the metal layer difficult and often results in an over-etching or imprecise etching of the critical dimensions of the metal layer. Additionally, the conventional dry etch chemistry can result in prematurely removing material from the sidewalls of the patterned photoresist as the exposed metal layer is being etched. Premature removal of the photoresist material from the patterned photoresist layer may result in a loss of the critical dimensions of the patterned photoresist features, which may correspond to a loss of critical dimensions of the features formed in the metal layer defined by the patterned photoresist layer.

The loss of critical dimensions of the pattern formed in the metal layer can detrimentally affect the light passing therethrough and produce numerous patterning and subsequent etching defects in the substrate patterned by the photomask. The loss of critical dimensions of the photomask can result in insufficient photolithographic performance for etching high aspect ratios of sub-micron features, and if the loss of critical dimensions is severe enough, the failure of the photomask or subsequently etched device.

Therefore, there remains a need for a process and chemistry for etching a metal layer on a substrate, such as a photomask, which produces a pattern with desired critical dimensions in the metal layer.

SUMMARY OF THE INVENTION

Aspects of the invention generally provide methods and related chemistry for etching a metal layer deposited on a silicon substrate, such as a photomask. In one aspect, a method is provided for processing a substrate including positioning the substrate on a support member in a processing chamber, wherein the substrate has a metal layer formed thereon and is maintained at a temperature of about 150° C. or less, introducing a processing gas comprising (i) hydrogen chloride, (ii) an oxygen containing gas, and (iii) another chlorine containing gas into the processing chamber, wherein the hydrogen chloride and another chlorine containing gas have a molar ratio between about 1:9 and about 9:1, delivering power to the processing chamber to generate a plasma, and etching exposed portions of the metal layer.

In another aspect, a method is provided for processing a substrate including positioning the substrate on a support member in a processing chamber, wherein the substrate has a metal layer formed thereon and a resist layer formed on the metal layer, introducing a processing gas comprising (i) hydrogen chloride, (ii) an oxygen containing gas, and (iii) another chlorine containing gas into the processing chamber, wherein the oxygen containing gas comprises between about 5 vol % and about 50 vol % of the processing gas, maintaining a chamber pressure between about 2 milliTorr and about 25 milliTorr, delivering power to the processing chamber to generate a plasma, and etching exposed portions of the metal layer and selectively removing the metal layer at a removal rate ratio of metal layer to resist of about 2:1 or greater.

In another aspect, a method is provided for processing a substrate having a conformal metal layer formed on a silicon based substrate with a patterned resist material deposited on the conformal metal layer, the method including positioning the substrate on a support member in a processing chamber having a coil, introducing a processing gas comprising (i) hydrogen chloride, (ii) an oxygen containing gas, (iii) chlorine gas, and (iv) an inert gas, wherein the hydrogen chloride and chlorine gas have a molar ratio of hydrogen chloride to chlorine gas between about 1:5 and about 3:2 and the oxygen containing gas comprises between about 5 vol % and about 50 vol % of the processing gas, maintaining a chamber pressure between about 10 milliTorr and about 20 milliTorr, supplying a source RF power of about 700 watts or less to the coil to generate a plasma in the processing chamber and supplying a bias power to the support member of about 50 Watts or less, maintaining the substrate at a temperature between about 50° C. and about 150° C., and etching exposed portions of the conformal metal layer.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Aspects of the invention will be described below in reference to an inductively coupled plasma etch chamber, such as a Decoupled Plasma Source, or DPS™, chamber manufactured by Applied Materials, Inc., of Santa Clara, Calif. Other process chambers may be used to perform the processes of the invention, including, for example, capacitively coupled parallel plate chambers and magnetically enhanced ion etch chambers as well as inductively coupled plasma etch chambers of different designs. Although the processes are advantageously performed with the DPS™ processing chamber, the description in conjunction with the DPS™ processing chamber is illustrative, and should not be construed or interpreted to limit the scope of aspects of the invention.

Figure 1:
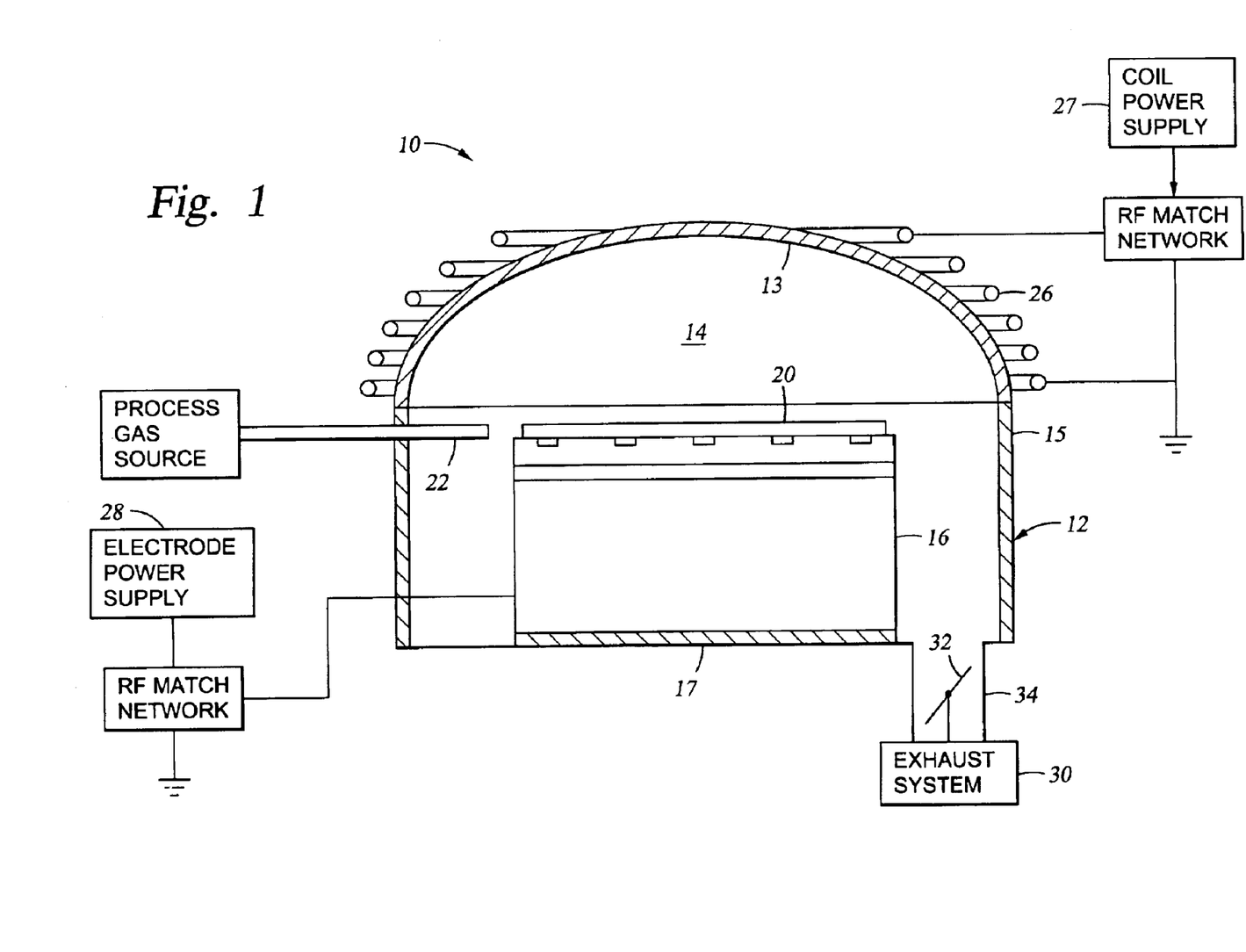
FIG. 1 is a schematic side view of one embodiment of an etching chamber.

FIG. 1 is a schematic cross-sectional view of one embodiment of a DPS™ processing chamber that may be used for performing the processes described herein. The processing chamber 10 generally includes a cylindrical sidewall or chamber body 12, an energy transparent dome ceiling 13 mounted on the body 12, and a chamber bottom 17. An inductive coil 26 is disposed around at least a portion of the dome 13. The chamber body 12 and the chamber bottom 17 of the processing chamber 10 can be made of a metal, such as anodized aluminum, and the dome 13 can be made of an energy transparent material such as a ceramic or other dielectric material. A substrate support member 16 is disposed in the processing chamber 10 to support a substrate 20 during processing. The support member 16 may by a conventional mechanical or electrostatic chuck with at least a portion of the support member 16 being electrically conductive and capable of serving as a process bias cathode. A plasma zone 14 is defined by the process chamber 10, the substrate support member 16 and the dome 13.

Processing gases are introduced into the processing chamber 10 through a gas distributor 22 peripherally disposed about the support member 16. A plasma is formed from the processing gases using a coil power supply 27 which supplies power to the inductor coil 26 to generate an electromagnetic field in the plasma zone 14. The support member 16 includes an electrode disposed therein, which is powered by an electrode power supply 28 and generates a capacitive electric field in the processing chamber 10. Typically, RF power is applied to the electrode in the support member 16 while the body 12 is electrically grounded. The capacitive electric field is transverse to the plane of the support member 16, and influences the directionality of charged species more normal to the substrate 20 to provide more vertically oriented anisotropic etching of the substrate 20.

Process gases and etchant byproducts are exhausted from the process chamber 10 through an exhaust system 30. The exhaust system 30 may be disposed in the bottom 17 of the processing chamber 10 or may be disposed in the body 12 of the processing chamber 10 for removal of processing gases. A throttle valve 32 is provided in an exhaust port 34 for controlling the pressure in the processing chamber 10. An optical endpoint measurement device can be connected to the processing chamber 10 to determine the endpoint of a process performed in the chamber.

Exemplary Etch Process

Generally a metal layer, such as chromium or molybdenum oxynitride, which is used to form the mask layer in the photomask, is etched to produce features having desired critical dimensions. The processing gas used in etching the metal layer includes (i) hydrogen chloride, (ii) an oxygen containing gas, and (iii) another chlorine containing gas. The processing gas may further include an inert gas. Hydrogen chloride is advantageously used to form passivating deposits on the surfaces, particularly the sidewalls, of features formed in a patterned resist material and etched metal layers. The resist materials include photoresist materials, such as such as "RISTON," manufactured by du Pont de Nemours Chemical Company, and electron beam exposure resists, such as commercially available ZEP7000. The passivating deposits prevent excessive etching of the features, thereby producing features having desired critical dimensions.

Hydrogen chloride and another chlorine containing gas selected from the group of chlorine ($Cl_2$), silicon tetrachloride ($SiCl_4$), boron trichloride ($BCl_3$), and combinations thereof, of which $Cl_2$ is preferred, are used to supply highly reactive radicals to etch the metal layer. The hydrogen chloride and the another chlorine containing gas are provided in a molar ratio of hydrogen chloride to another chlorine containing gas of between about 1:9 and about 9:1, i.e., hydrogen chloride comprises between about 10% and about 90% of the hydrogen chloride and the another chlorine containing gases. A molar ratio of hydrogen chloride to the another chlorine containing gas of between about 1:5 and about 3:2, i.e., hydrogen chloride comprises between about 16% and about 60% of the hydrogen chloride and the another chlorine containing gases, may be used to etch a photomask layer. In one aspect, a molar ratio of hydrogen chloride to the another chlorine containing gas of between about 3:7 and about 1:1, i.e., hydrogen chloride comprises between about 30% and about 50% of the hydrogen chloride and the another chlorine containing gas, has been used to etch a photomask layer.

The addition of an oxygen containing gas, such as oxygen ($O_2$), to the processing gas also provides a source of etching radicals and may further remove passivating deposits and minimize the formation of passivating deposits. The oxygen containing gas comprises between about 5 vol % and about 50 vol % of the active processing gases. The active processing gases are generally considered to be the hydrogen chloride, the another chlorine containing gas, and the oxygen containing gas. An oxygen concentration between about 5 vol % and 30 vol %, preferably between about 8 vol % and about 12 vol %, of the active processing gases may be used in the processing gas for the etching process.

In an alternative embodiment, the oxygen containing gas can be combined with a carbon containing oxygen based gas or be substituted by the carbon containing oxygen based gas, such as carbon monoxide (CO) and carbon dioxide ($CO_2$), to also provide a source of carbon species which may enhance passivating deposit formation on the features during the etching process.

The processing gas may also include an inert gas which, when ionized as part of the plasma including the processing gas, results in sputtering species to increase the etching rate of the features. The presence of an inert gas as part of the plasma may also enhance dissociation of the active processing gases. Examples of inert gases include argon (Ar), helium (He), neon (Ne), xenon (Xe), krypton (Kr), and combinations thereof, of which argon and helium are generally used. The inert gases typically comprise between about 25 vol % and about 30 vol % of the total gas flow for the process.

The total flow of the processing gases, including the inert gases, are between about 105 sccm and about 420 sccm for a 200 mm etch chamber. Typically, a total processing gas flow between about 185 sccm and about 340 sccm, preferably between about 200 sccm and about 240 sccm, is used in the etching process described herein. However, the total gas flow of the processing gas, including the inert gas flow, may vary based upon a number of processing factors, such as the size of the processing chamber, the size of the substrate being processed, and the specific etching profile desired by the operator.

Generally, the processing chamber pressure is maintained between about 2 milliTorr and about 25 milliTorr. A chamber pressure between about 10 milliTorr and about 20 milliTorr, preferably between about 15 milliTorr and about 20 milliTorr may be maintained during the etching process.

The substrate is maintained at a temperature of about 150° C. or less during processing to minimize heat degradation of materials, such as resist materials, deposited on the substrate during the photomask fabrication processes with the processing gases described herein. The substrate temperature is generally maintained between about 50° C. and about 150° C. during etching of the substrate surface. A temperature between about 80° C. and about 100° C. may be used to etch the photomask features with minimal heat degradation of material disposed on the substrate surface. It is also believed that the substrate temperature helps regulate the formation of passivating deposits by limiting passivating reactions during the etching process. Additionally, the sidewalls of the processing chamber are maintained at a temperature of less than about 70° C. and the dome is maintained at a temperature of less than about 80° C. to maintain consistent processing conditions and to minimize passivating deposit formation on the surfaces of the processing chamber.

Generally, a source RF power level of about 1000 watts or less is applied to an inductor coil to generate and sustain a plasma of the processing gases during the etching process. A power level between about 300 watts and about 700 watts may be used during the etching process. A power level between about 450 watts and about 650 watts has been observed to provide sufficient plasma of the processing gases sufficient for etching the substrate surface. The recited source RF power levels have been observed to produce sufficient etching radicals and passivating radicals from the processing gases to etch the exposed metal layer disposed on the substrate while providing a sufficiently low power level compared to prior art metal etch processes to maintain the substrate at temperatures between about 50° C. and about 150° C.

Generally, a bias power of less than about 200 watts is also applied to the substrate to increase directionality of the etching radicals with respect to the surface of the substrate. A bias power of less than 50 watts, such as between about 5 watts and about 40 watts, is typically used in the etching process. A bias between about 5 watts and 20 watts has been observed to provide sufficient directionality of etching radicals during the etching process.

It has been observed that the etching process described herein under the conditions disclosed produces a removal rate ratio, i.e., selectivity, of chrome to resist of about 2:1 or greater. A selectivity of chrome to resist of about 2.5:1 or greater has been observed in substrate processed by the etching process described herein.

It is believed that generating a plasma of the processing gases at reduced power levels and reduced substrate temperatures removes exposed portions of the metal layer without excessive etching of the sidewalls of the features formed in the resist material and those features being formed in the metal layer during etching to produce the desired critical dimensions. It is also believed that the reduced power levels and reduced substrate temperatures prevent resist degradation to produce features in the metal layer substantially having the critical dimensions of the features defined in the resist material.

While the following description illustrates one embodiment of a process sequence for etching metal layers, such as chromium, in photomasks fabrication, it is contemplated that the etching gases may be used to etch other metal layers formed on substrates in semiconductor and photomask manufacturing.

Figure 2:
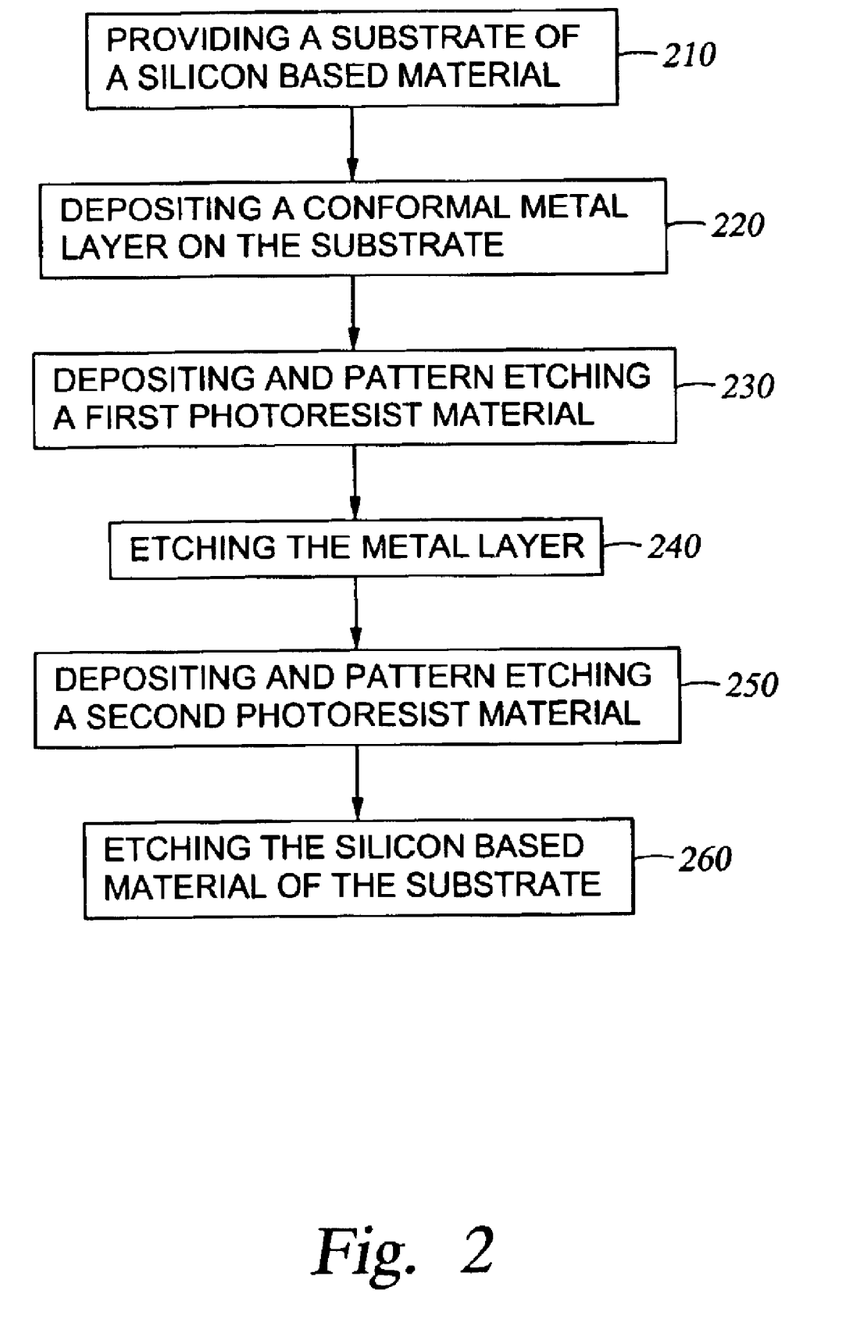
FIG. 2 is a flow chart illustrating one embodiment of a sequence for processing a substrate according to one embodiment of the invention.

FIG. 2 is a flow chart of one embodiment of one process sequence of an etching process. The flow chart is provided for illustrative purposes and should not be construed as limiting the scope of aspects of the invention. A substrate, typically comprising a silicon based material, such as optical quality quartz or molybdenum silicide, is provided to a processing chamber at step 210, such as the DPS™ processing chamber 10 of FIG. 1. The substrate is then processed by depositing an opaque, conformal metal layer, typically chromium, on the substrate at step 220.

The dimensions of features to be formed in the metal layer are patterned by depositing and pattern etching a first resist material to expose the conformal metal layer at step 230. The resist materials used in photomask fabrication are usually low temperature photomask materials, which is defined herein as photomask materials that thermally degrade at temperatures below about 250° C. Features are then formed in the substrate by etching the conformal metal layer to expose the underlying substrate at step 240. Then the remaining resist materials are removed.

The substrate may then be further processed to etch the silicon based materials. The silicon based material of the substrate is prepared for etching by depositing and pattern etching a second resist material 250 to expose the substrate. The substrate is then transferred to a DPS™ processing chamber where a processing gas containing hydrogen chloride is introduced into the processing chamber and a plasma is generated, thereby etching 260 the exposed silicon based material of the substrate. Etching of the silicon based material of the substrate is more fully described in co-pending patent application Ser. No. 09/625,313, entitled "A Method and Apparatus for Etching Photomasks," filed on Jul. 25, 2000, and incorporated herein by reference to the extent not inconsistent with aspects of the invention.

Figure 3A:
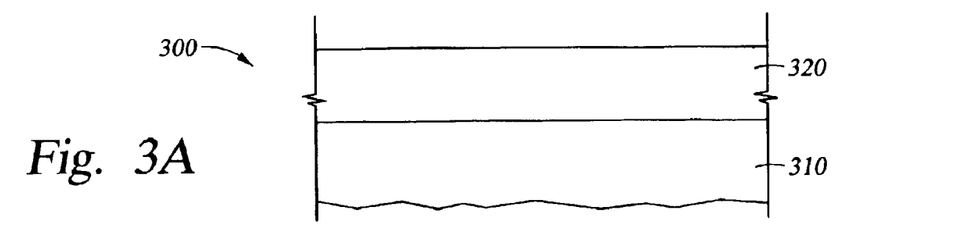
FIGS. 3A–3E are cross-sectional views showing an etching sequence of another embodiment of the invention.

FIGS. 3A–3E illustrate the composition of the photomask prior to the etching steps as well as further illustrate the process described above in FIG. 2. A substrate 300, typically made of optical quality quartz material 310, is introduced into a processing chamber. A metal layer 320 made of chromium is deposited on the quartz material 310 as shown in FIG. 3A. The chromium layer may be deposited by conventional methods known in the art, such as by physical vapor deposition (PVD) or chemical vapor deposition (CVD) techniques. The chromium layer 320 is typically deposited to a thickness between about 100 and about 200 nanometers (nm) thick, however, the depth of the layer may change based upon the requirements of the manufacturer and the composition of the materials of the substrate or metal layer.

Figure 3B:
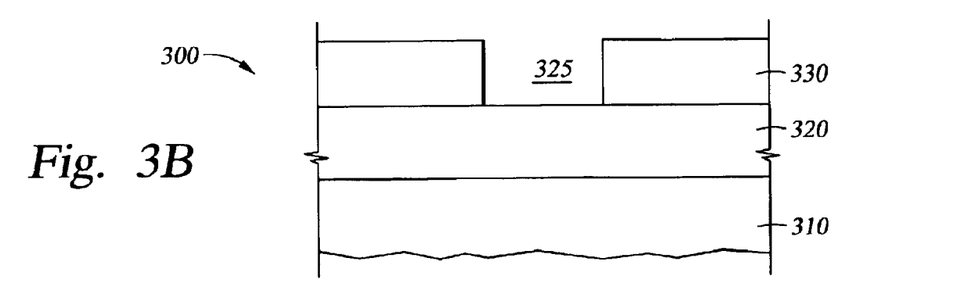

Referring to FIG. 3B, the substrate 300 is then transferred to another processing chamber where a layer of resist material 330, such as "RISTON," manufactured by Du Pont de Nemours Chemical Company, is deposited upon the chromium layer 320 to a thickness between about 200 and 600 nm thick. The resist material 330 is then pattern etched using conventional laser or electron beam patterning equipment to form a first opening 325 which is used to define the dimensions of the second opening 335 to be formed in the chromium layer 320.

Figure 3C:
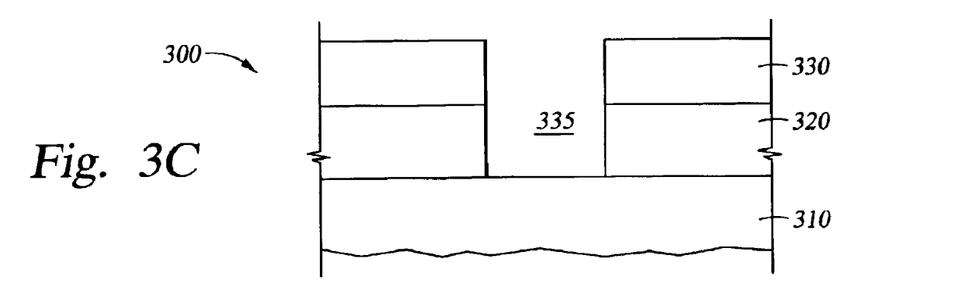

The substrate 300 is then transferred to an etch chamber, such as the DPS™ processing chamber 10 described above, and the chromium layer 320 is etched using metal etching techniques known in the art or by new metal etching techniques that may be developed to form the second opening 335 which expose the underlying quartz material 310 as shown in FIG. 3C.

An exemplary processing regime for etching metal layers on substrates with hydrogen chloride described herein is as follows. The substrate is placed on the support member 16, and a processing gas is introduced into the chamber and a plasma is generated to etch the chromium layer 320.

In one embodiment of the processing gas, the processing gas comprises hydrogen chloride, an oxygen containing gas, the another chlorine containing gas, and an inert gas. The processing gas is introduced into the processing chamber at a flow rate between about 185 sccm and about 340 sccm. For example, a flow rate of about 200 sccm may be used during the etching process. The hydrogen chloride is introduced into the processing chamber at a flow rate between about 40 sccm and about 100 sccm. The oxygen containing gas comprises, for example, oxygen and is introduced into the processing chamber at a flow rate between about 5 sccm and about 100 sccm. The another chlorine containing gas, for example, chlorine ($Cl_2$), is introduced into the processing chamber at a flow rate between about 40 sccm and about 100 sccm. The inert gas, for example, helium, is introduced into the processing chamber at a flow rate between about 30 sccm and about 80 sccm.

Generally, the processing chamber pressure is maintained between about 2 milliTorr and about 25 milliTorr. A chamber pressure between about 10 milliTorr and about 20 milliTorr may be maintained during the etching process. The actual flow rates of the compounds comprising the processing gas are dependent upon the volume of the processing chamber and the desired amount of etching required. Thus, aspects described herein should not be limited to the flow rates recited herein.

A source RF power between about 200 watts and about 700 watts is applied to an inductor coil to generate and sustain a plasma of the processing gases during the etching process. A bias power between about 5 watts and about 40 watts is applied to the substrate support. The actual source RF power and bias power levels are dependent upon the needed process controls and type of structures being etched. For example, in advanced photoetch masks, smaller features need to be etched and a greater degree of control needs to be exercised over the etching process. The greater degree of control, i.e., the higher precision of the etching process required, is generally exercised by controlling the power levels, typically by reducing the power levels to provide a slower etch, to reach the achieved degree of etching. Thus the processing parameters, such as the power levels recited herein, should not be interpreted or construed as limiting the scope of aspects of the invention.

The substrate temperature is maintained at between about 50° C. and about 150° C. during the etching process. Additionally, the sidewalls 15 of the processing chamber 10 are maintained at a temperature of about less than about 70° C. and the dome is maintained at a temperature of less than about 80° C. The above described metal etching process generally produces a selectivity of metal layer to resist of about 2:1 or greater.

Referring to FIGS. 3A–3C, after etching of the chromium layer 320 is completed, the substrate 300 is transferred to a processing chamber, and the remaining resist material 330 is usually removed from the substrate 300, such as by an oxygen plasma process, or other resist removal technique known in the art.

Figure 3D:
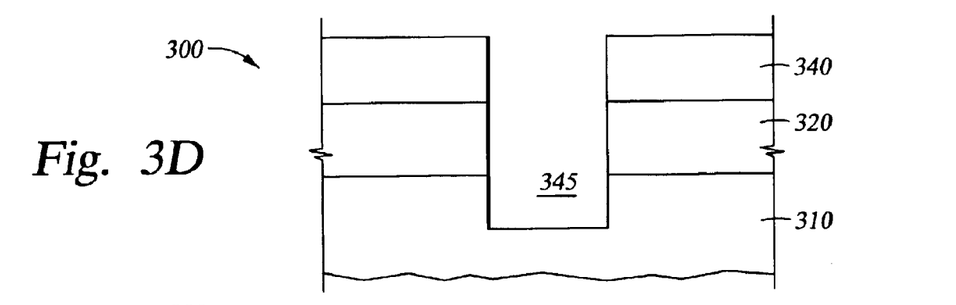
Figure 3E:
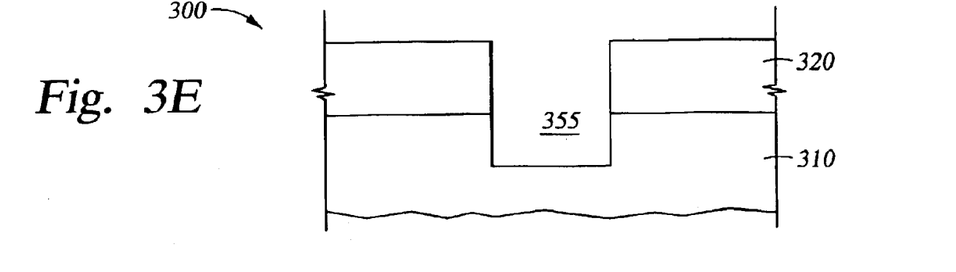

Referring to FIGS. 3D and 3E, the substrate 300 may be further processed by etching the quartz material 310. In etching the quartz material 310, the resist material 330 is removed and a second resist material 340 is applied and patterned to expose the underlying quartz material 310 within the second opening 335. The resist material is deposited to a depth between about 200 nm and 600 nm thick, but may be of any thickness and may also be of the same thickness as the depth of the features to be etched in the quartz material 310 to form the photomask. The substrate 300 is then etched to form a third opening 345 in the resist layer 340, the metal layer 320, and the quartz material 310. The second resist material 340 is removed to form a patterned substrate surface 355. The patterned substrate 300 is then transferred to an etch chamber, such as the DPS™ processing chamber 10, for plasma etching the quartz material 310.

The above described processing gas composition and processing regime is believed to provide controllable etching of openings or patterns with desired critical dimensions. The etching of the openings or patterns may be managed by producing and controlling the formation of passivating deposits that condense on the sidewalls and bottom of the openings. It is believed that the passivating deposits are etched and removed from the surface before the underlying material may be etched, thereby resulting in a decrease in the etching rate of the material underlying the passivating deposits and improved selectivity to resist removal over metal layer removal.

Additionally, the plasma etching process is generally anisotropic. The anisotropic process will remove material deposited on the bottom of the opening at a higher rate than material on the sidewalls of the opening. This results in passivating deposits on the sidewalls of the openings being removed at a lower rate than passivating deposits on the bottoms of openings. The combination of the anisotropic etch of the plasma etching process and the passivating deposits formed on the sidewalls of openings will increase the etching rate of the bottom of the opening in contrast to the etching rate of the sidewalls of the opening. An etch process that etches the sidewalls of the openings at a slower rate will be less likely to over-etch the sidewalls of the openings during the etching process will allow for improved preservation of the critical dimensions of the openings being etched.

It is believed that the processing gas including hydrogen chloride allows the formation of openings with the desired critical dimensions by preventing the chemical breakdown of the resist material during etching. It is further believed that the hydrogen chloride prevents the chemical breakdown of the resist material by the hydrogen component of the hydrogen chloride performing as a reducing agent to prevent excessive oxidation of the resist material by the oxygen containing gas during etching. The hydrogen may also reduce chromium oxide, which is harder to etch, to chromium metal to increase etching of the metal layer when oxygen is included in the processing gas.

The invention is further described by the following examples that are not intended to limit the scope of the claimed invention.

The Etching Process

A photomask including a substrate made of a silicon based material, preferably optical quality quartz with a chromium layer approximately 100 nanometers (nm) thick disposed thereon is introduced into a processing chamber for photoresist deposition. A photoresist, such as "RISTON," manufactured by du Pont de Nemours Chemical Company, is deposited upon the chromium photomask and then patterned using conventional laser or electron beam patterning equipment. The photoresist deposited on the etched photomask is between about 200 nm and about 600 nm thick, for example, between about 300 nm and about 570 nm thick, but may be of any thickness desired. The photoresist thickness may be about the same thickness as the chromium layer to be etched to expose the silicon based material underlying the chromium layer.

The photomask is placed in an etch chamber such as the DPS™ metal etch chamber described above. The patterned substrate described above is placed on the cathode pedestal of the etch chamber, and the chamber was maintained at a pressure of about 15 millitorr and about 20 millitorr, such as about 18 milliTorr. A plasma was generated by applying a source RF voltage to the inductor coil at a power level of about 550 Watts. A bias power of 5 Watts was applied to the cathode pedestal. The substrate surface is maintained at a temperature between about 70° C. and about 80° C. The chamber walls and dome were cooled to about 70° C. to maintain a steady etch processing condition. The etching of the opening occurred under the following gas flows:

| HCl, at | 54 sccm |
|---|---|
| $Cl_2$, at | 81 sccm |
| $O_2$, at | 15 sccm |
| Helium (He), at | 60 sccm |

The total flow rate was between about 100 and about 300 sccm, approximately 210 sccm for the above listed processing gases. The etching process was performed for a sufficient time to form the openings in the metal layer. An etch selectivity of chrome to photoresist material of about 3.2:1 was observed.

Experimental Data

A series of photomasks were processed with the processing gases described herein. Substrates used for forming the photomasks in the experiment included 6"×6"×0.25" Hoya binary chrome blanks with 100 nm of $CrO_xN_y/Cr$ and coated with 300 nm ZEP7000 resist material. The substrates were patterned on the MEBES 4700 system using a DOSE 8 electron beam exposure of 1% of the chrome. Etching of the substrates was performed in an Applied Materials' Photomask Etch Chamber. A Nanospec® FTP 500 device was used to measure resist thickness before and after processing. Critical Dimensions (CD) measurements were performed at 121 locations on the mask using a Leica Line Width measurement (LWM) tool utilizing reflected light for CD's in resist and transmitted light for CD's in chrome. The mean-to-target (MTT) and CD uniformity of the substrates was analyzed. The Mean CD of interest for test purposes was the 720 nm opening. MTT is the difference between the target CD of 720 nm and the CD measured.

The etching parameters included a source RF voltage to the inductor coil at a power level of about 550 Watts, a bias power of 5 Watts, a total active gas flow of 145 sccm and an inert gas flow of 30 sccm. The wall and dome temperatures were 70° C. and 80° C., respectfully, for all experiments. The passivating gas was hydrogen chloride and chlorine gas at a concentration of about 40% hydrochloric gas and 60% chlorine gas for all experiments. Etching pressures and active gas compositions were as follows:

TABLE 1

Processing Variables

| Run | Pressure (mTorr) | Passivating Gas Flow (sccm) | Oxygen ($O_2$) Flow (sccm) |
|---|---|---|---|
| 1 | 10 | 40 | 25 |
| 2 | 20 | 40 | 5 |
| 3 | 10 | 90 | 5 |
| 4 | 20 | 90 | 25 |
| 5 | 15 | 65 | 15 |

Initial comparison of the passivating gas additive with the standardized chemistry of chlorine, oxygen, and helium, versus the standardized chemistry indicated a resist selectivity of chrome to resist of at least about 2:1 or greater, which is an improvement over the standardized chemistry selectivity by a factor of 2 or more.

Comparison of the results from the experiment indicated that increase oxygen flow rate resulted in increase chromium etch rates and resist etch rates. Additionally, an increase ratio of etching of resist compared to etching of chrome, i.e., selectivity, was observed for increasing chamber pressure. Pressure and oxygen flow rates were observed to strongly influence etch rates, with chamber pressure controlling the etch selectivity of materials.

A second experiment was performed with three factors being varied: pressure was varied between 9 mtorr and 18 mtorr, passivating gas concentration was varied between 25 vol % and 75 vol %, and oxygen ($O_2$) gas concentration was varied between 30 vol % and 60 vol %. The total flow was held constant at 105 sccm with the power at 550 Watts and a bias of 5 Watts.

The second experiment indicated that the MTT and selectivity were inversely proportional to one another, such that higher chrome to resist selectivities resulted in lower MTT. It was also observed that MTT and uniformity of the etching process were directly proportional to one another. Chrome to resist selectivities ranged from <1:1 to 2.5:1. The experimental run with the highest selectivity also gave the best MTT and the best CD uniformity across the mask.

A third experiment was performed at an optimized total gas flow of 210 sccm and 550 watts, helium at 30% of the total gas flow, and variation of the passivating gas flow rate and oxygen flow rate. Examination of the CD distribution of the deposited wafers indicated a net MTT of 10 nm and a CD uniformity of 14 nm, at three times the standard deviation. The data further indicated that reduced oxygen flow rate improved MTT, CD uniformity, as well as improved selectivity to the resist over chrome.

Further experimental data is shown in the technical paper, "Chrome Etch for <0.13 μm Advanced Reticle Production," written by Melisa J. Buie, Brigette Stoehr, and Yi-Chiau Huang, which is a part of the specification herein, and is attached as Appendix A.

While the foregoing is directed to the preferred aspects of the invention, other and further aspects of the invention may be devised without departing from the basic scope thereof, and the scope thereof is determined by the claims that follow.

What is claimed is:

1. A method for processing a substrate, comprising:
positioning the substrate on a support member in a processing chamber having a coil, wherein the substrate has a chromium layer formed on an optical quality silicon based material with a patterned resist material deposited on the chromium layer and is maintained at a temperature of about 150° C. or less;
introducing a processing gas comprising (i) hydrogen chloride, (ii) an oxygen containing gas, and (iii) another chlorine containing gas into the processing chamber, wherein the hydrogen chloride and the another chlorine containing gas have a molar ratio between about 1:9 and about 9:1;
delivering power to the coil to generate a plasma;
applying a bias power to the support member, wherein the bias power is about 5 watts and about 50 watts; and
etching exposed portions of the metal layer.

2. The method of claim 1, wherein the oxygen containing gas is selected from the group of oxygen ($O_2$), carbon monoxide (CO), carbon dioxide ($CO_2$), and combinations thereof and the another chlorine containing gas is selected from the group of chlorine ($Cl_2$), silicon tetrachloride ($SiCl_4$), boron trichloride ($BCl_3$), and combinations thereof.

3. The method of claim 1, wherein the oxygen containing gas comprises between about 5 vol. % and about 50 vol. % of the processing gas.

4. The method of claim 1, wherein the substrate is maintained at a temperature between about 50° C. and about 150° C. and the processing chamber is maintained at a pressure between about 2 milliTorr and about 25 milliTorr.

5. The method of claim 1, wherein delivering power to the processing chamber comprises applying a source RF power between about 250 Watts and about 700 Watts to a coil disposed in the processing chamber.

6. The method of claim 1, wherein the bias power to the support member comprises between about 5 and about 40 watts.

7. The method of claim 1, wherein the molar ratio of hydrogen chloride to another chlorine containing gas is between about 1:5 and about 3:2.

8. The method of claim 1, wherein the molar ratio of hydrogen chloride to another chlorine containing gas is between about 3:7 and about 1:1.

9. The method of claim 1, wherein the resist material and the chromium layers are removed at a removal rate ratio of chromium to resist of about 2:1 or greater.

10. The method of claim 1, wherein the processing gas further comprises an inert gas selected from the group of helium, argon, xenon, neon, krypton, and combinations thereof.

11. The method of claim 10, wherein etching the substrate comprises introducing hydrogen chloride (HCl), oxygen ($O_2$), chlorine ($Cl_2$), and helium, into a processing chamber, maintaining the processing chamber at a pressure between about 2 milliTorr and about 25 milliTorr, maintaining the substrate at a temperature between about 50° C. and about 150° C., and generating a plasma by supplying a source RF power between about 250 Watts and about 700 Watts to the processing chamber, wherein the molar ratio of hydrogen chloride to another chlorine containing gas is between about 1:9 and 9:1 and the oxygen containing gas comprises between about 5 vol. % and about 50 vol. % of the processing gas.

12. A method for processing a substrate, comprising:
positioning the substrate on a support member in a processing chamber having a coil, wherein the substrate has a chromium layer formed on an optical quality silicon based material with a patterned resist material deposited on the chromium layer;

introducing a processing gas comprising (i) hydrogen chloride, (ii) an oxygen containing gas, and (iii) another chlorine containing gas, and (iv) an inert gas into the processing chamber, wherein the oxygen containing gas comprises between about 5 vol % and about 50 vol % of the processing gas;

maintaining a chamber pressure between about 2 milliTorr and about 25 milliTorr;

delivering power to the coil to generate a plasma;

applying a bias power to the support member, wherein the bias power is about 50 Watts or less; and etching exposed portions of the chromium layer and selectively removing the chromium layer at a removal rate ratio of chromium layer to resist of about 2:1 or greater.

13. The method of claim 12, wherein the oxygen containing gas is selected from the group of oxygen ($O_2$), carbon monoxide (CO), carbon dioxide ($CO_2$), and combinations thereof and the another chlorine containing gas is selected from the group of chlorine ($Cl_2$), silicon tetrachloride ($SiCl_4$), boron trichloride ($BCl_3$), and combinations thereof.

14. The method of claim 12, wherein the oxygen containing gas comprises between about 5 vol. % and about 30 vol. % of the processing gas.

15. The method of claim 12, wherein the substrate is maintained at a temperature between about 50° C. and about 150° C. and the processing chamber is maintained at a pressure between about 10 milliTorr and about 20 milliTorr.

16. The method of claim 12, wherein delivering power to the processing chamber comprises applying a source RF power between about 250 Watts and about 700 Watts.

17. The method of claim 12, wherein the bias power to the support member comprises between about 5 and about 40 watts.

18. The method of claim 12, wherein the molar ratio of hydrogen chloride to another chlorine containing gas is between about 9:1 and 1:9.

19. The method of claim 12, wherein the molar ratio of hydrogen chloride to another chlorine containing gas is between about 1:5 and about 3:2 and the oxygen containing gas comprises between about 8 vol. % and about 12 vol. % of the processing gas.

20. The method of claim 12, wherein the processing gas further comprises an inert gas selected from the group of helium, argon, xenon, neon, krypton, and combinations thereof.

21. The method of claim 20, wherein etching the substrate comprises introducing hydrogen chloride, oxygen ($O_2$), chlorine ($Cl_2$), and helium, into a processing chamber, maintaining the processing chamber at a pressure between about 10 milliTorr and about 20 milliTorr, maintaining the substrate at a temperature between about 50° C. and about 150° C., and generating a plasma by supplying a source RF power between about 250 Watts and about 700 Watts to the processing chamber, wherein the molar ratio of hydrogen chloride to chlorine gas is between about 1:5 and 3:2 and the oxygen containing gas comprises between about 5 vol. % and about 30 vol. % of the processing gas.

22. A method for etching a substrate having a conformal chromium layer formed on an optical quality silicon based material with a patterned resist material deposited on the conformal chromium layer, the method comprising:

positioning the substrate on a support member in a processing chamber having a coil;

introducing a processing gas comprising (i) hydrogen chloride, (ii) an oxygen containing gas, (iii) chlorine gas, and (iv) an inert gas, wherein the hydrogen chloride and chlorine gas have a molar ratio of hydrogen chloride to chlorine gas between about 1:5 and 3:2 and the oxygen containing gas comprises between about 5 vol % and about 50 vol % of the processing gas;

maintaining a chamber pressure between about 10 milliTorr and about 20 milliTorr;

supplying a source RF power of between about 250 Watts and about 700 Watts to the coil to generate a plasma in the processing chamber and supplying a bias power to the support member of between about 5 and about 40 watts;

maintaining the substrate at a temperature between about 50° C. and about 150° C; and etching exposed portions of the conformal metal chromium layer.

23. The method of claim 22, wherein the oxygen containing gas comprises between about 5 vol. % and about 30 vol. % of the processing gas.

24. The method of claim 22, wherein the oxygen containing gas is selected from the group of oxygen ($O_2$), carbon monoxide (CO), carbon dioxide ($CO_2$), and combinations thereof and the inert gas is selected from the group of helium, argon, xenon, neon, krypton, and combinations thereof.

25. The method of claim 22, wherein the molar ratio of hydrogen chloride to chlorine gas is between about 3:7 and about 1:1.

26. The method of claim 22, wherein the resist material and chromium layer is removed at a removal rate ratio of chromium layer to resist of about 2:1 or greater.

* * * * *

UNITED STATES PATENT AND TRADEMARK OFFICE
CERTIFICATE OF CORRECTION

PATENT NO. : 7,018,934 B2 Page 1 of 1
APPLICATION NO. : 10/235223
DATED : March 28, 2006
INVENTOR(S) : Melisa J. Buie and Brigitte C. Stoehr

It is certified that error appears in the above-identified patent and that said Letters Patent is hereby corrected as shown below:

Column 5, Line 15: Delete "such as"

Column 10, Line 66: Change "respectfully" to --respectively--

Signed and Sealed this

Twenty-first Day of November, 2006

JON W. DUDAS
*Director of the United States Patent and Trademark Office*